United States Patent

Paul

(10) Patent No.: US 8,064,253 B2
(45) Date of Patent: Nov. 22, 2011

(54) MULTI-VALUED ROM USING CARBON-NANOTUBE AND NANOWIRE FET

(75) Inventor: Bipul C. Paul, Santa Clara, CA (US)

(73) Assignee: Toshiba America Research, Inc., Washington, DC (US)

( * ) Notice: Subject to any disclaimer, the term of this patent is extended or adjusted under 35 U.S.C. 154(b) by 140 days.

(21) Appl. No.: 12/560,040

(22) Filed: Sep. 15, 2009

(65) Prior Publication Data

US 2011/0063905 A1    Mar. 17, 2011

(51) Int. Cl.
*G11C 16/04* (2006.01)
(52) U.S. Cl. .......... 365/185.03; 365/185.18; 365/185.28
(58) Field of Classification Search ............. 365/185.03, 365/185.01, 151, 185.28, 185.18
See application file for complete search history.

(56) References Cited

U.S. PATENT DOCUMENTS

| | | | |
|---|---|---|---|
| 5,719,520 A | 2/1998 | Au et al. | |
| 5,721,701 A * | 2/1998 | Ikebe et al. | 365/185.03 |
| 6,955,937 B1 | 10/2005 | Burke et al. | |
| 7,262,991 B2 * | 8/2007 | Zhang et al. | 365/185.01 |
| 7,342,277 B2 | 3/2008 | Radosavljevic et al. | |
| 7,381,983 B2 | 6/2008 | Bae et al. | |
| 7,608,883 B2 * | 10/2009 | Radosavljevic et al. | 257/315 |
| 2006/0183278 A1 | 8/2006 | Bertin et al. | |
| 2006/0237857 A1 | 10/2006 | Bertin et al. | |

OTHER PUBLICATIONS

Nishant Patil, et al, "Integrated Wafer-Scale growth and Transfer of Directional Carbon Nanotubes and Misaligned-Carbon-Nanotube-Immune Logic Structures", Symposium on VLSI Techonology Digest of Technical Papers, 2008, pp. 205-206.
Ali Javey, et al., "Self-Aligned Ballistic Molecular Transistors and Electrically Parallel Nanotube Arrays", NANO Letters, May 24, 2004, pp. 319-1322, vol. 4, No. 7, American Chemical Society.
David A. Rich, "A Survey of Multivalued Memories", IEEE Transactions on Computers, Feb. 1986, pp. 99-106, vol. C-35, No. 2.
Sung Dae Suk, et al., "TSNWFET for SRAM Cell Application: Performance Variation and Process Dependency", pp. 1-2, Advanced Technology Development Team, R&D Center, Samsung Electronics Co.

* cited by examiner

*Primary Examiner* — Gene N. Auduong
(74) *Attorney, Agent, or Firm* — Westerman, Hattori, Daniels & Adrian, LLP (57) ABSTRACT

A multivalued memory device which includes a first multivalued memory transistor and a second multivalued memory transistor, wherein each transistor has a channel made from at least one carbon nanotube or nanowire, wherein data is stored by varying the number of carbon nanotubes or nanowires used in the channel, wherein the channel is the at least one carbon nanotube or nanowire which allows current to flow through it.

20 Claims, 7 Drawing Sheets

CNFET / NWFET

FIG. 1(a)

PFET          NFET

MULTI-VALUED ROM USING CARBON-NANOTUBE AND NANOWIRE FET

BACKGROUND

1. Field of the Invention

The present invention relates, e.g., to memory devices and, in preferred embodiments, to a multi-valued memory device using carbon nanotube and nanowire FET.

2. Background Discussion

The following description sets forth the inventor's knowledge of related art and problems therein and should not be construed as an admission of knowledge in the prior art. Throughout this disclosure, the phrases carbon nanotube (CNT) and nanowire (NW) will be used interchangeably. For the purposes of this disclosure, both CNTs and NWs can be used interchangeably.

Traditionally a memory cell stores only 1 bit (binary) of information, i.e., either '0' or '1'. However, if the memory cell is capable of storing more values besides '0' or '1' (known as a multi-valued memory cell), the overall memory size can be significantly reduced compared to a memory consisting of 1 bit cells for storing a similar amount of information. That is, traditionally the storage capacity of a memory cell has a direct relationship with the amount of area that memory cell occupies.

For example, using a 2 bit multi-valued cell, capable of storing any of 4 ($2^2$) values, the memory size can be reduced by two times compared to a memory consisting of 1 bit cells. Similarly, a three times reduction in size of the memory device can be achieved by using 3 bit cells; a four times reduction in size of the memory device can be achieved by using 4 bit cells and so on.

Previously, multi-valued ROM (read only memory) has been implemented through various different means. For example, a multivalued ROM has been implemented by engineering different threshold voltages of the cell transistor, representing different memory values through implantation. However, introducing various levels of implantation is a complex process and is not cost effective.

The problem has also attempted to be solved by varying the width of the transistor, however this solution has the disadvantage of providing unreliable operation. Also, varying the transistor size substantially contributes to a larger memory cell size, thereby severely limiting the advantages of the multi-valued ROM.

Figure 1A:
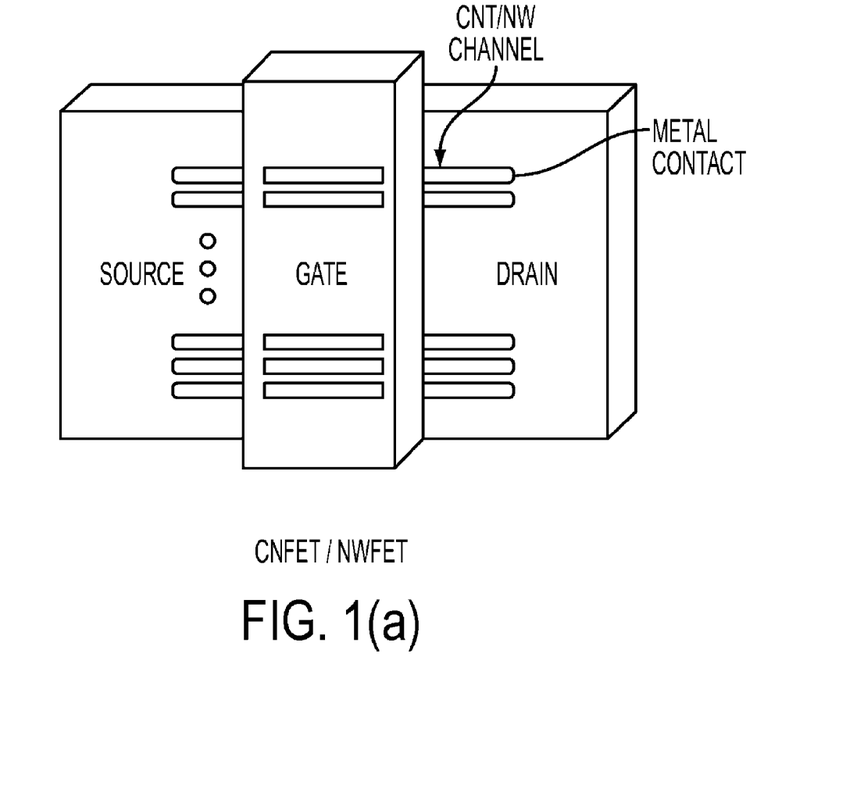
FIG. 1(a) shows a conventional transistor using carbon nanotubes or nanowires.
Figure 1B:
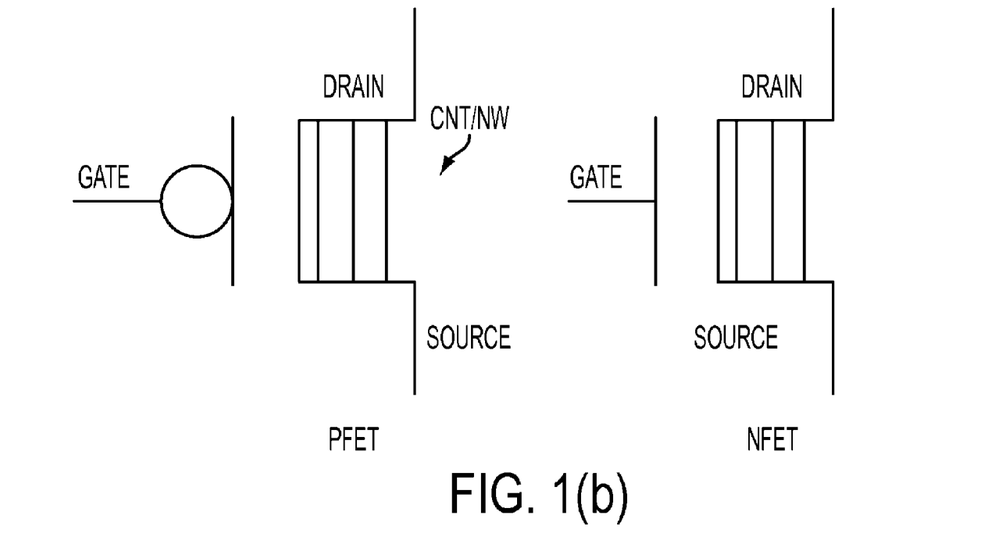
FIG. 1(b) shows a conventional P-type field effect transistor using carbon nanotubes or nanowires and also shows a conventional N-type field effect transistor using carbon nanotubes or nanowires.

FIG. 1(a) shows a schematic diagram of a conventional field effect transistor (FET) with a channel consisting of CNTs/NWs. This is known as a carbon nanotube field effect transistor (CNFET). Conversely, a nanowire field effect transistor is known as an NWFET. The ON current of the transistor is determined by the characteristics and number of the CNTs/NWs. The ON current in these kinds of transistors vary linearly with the number of CNTs/NWs comprising the channel.

That is, the more CNTs/NWs are used as the transistor channel, the greater the ON current will be. A CNFET/NWFET works by applying a voltage to the gate of the electrode. This voltage induces an electric field which envelopes the CNTs/NWs. When the CNTs/NWs are in an electric field, their internal resistance decreases. This reduced internal resistance allows current to flow through the CNTs/NWs. The more CNTs/NWs are used as the transistor channel, the higher the ON current will be when a voltage is applied to the gate.

SUMMARY

The preferred embodiments of the present invention improve upon the foregoing and other background technologies.

According to an embodiment of the invention, multi-valued ROM cells are created by controlling the number of nanotube/nanowire channels in carbon nanotube and nanowire FETs (CNFET/NWFET), in order to store different values in the memory cell. This leads to a reduced area of the memory cell, resulting in a smaller and more compact design. Further, this smaller design allows for a low power consumption and high performance of the memory cell.

During a read operation of the memory device and based on the transistor current ($I_{DS}$), the data can be read through an analog to digital converter (ADC). That is, the drain current will vary depending on the number of CNTs/NWs used in the transistor. The more CNTs/NWs are used, the higher the drain current will be for a given applied voltage at the gate of the transistor. These different levels of channel current can then be sensed by an analog to digital converter (ADC), which can output the corresponding digital value stored in the memory cell.

In another embodiment, the current can also be directly sensed, where a digital output is not needed.

ROM based logic (RBL) design and more specifically, the embodiments described herein, can be used for low power consumption and high performance applications. Examples include: Adders, Multipliers, ALUs, FFTs, FIRs filters, and any other digital logic function devices.

Also, any ROM application such as computer keyboard, where the content values are known during the design/fabrication process, can also be implemented using the embodiments described herein. The embodiments described herein can also be suitable for multi-valued image processors and multi-valued microprocessor applications, for example.

According to one embodiment, it comprises a multivalued memory device including a first multivalued memory transistor and a second multivalued memory transistor, wherein each transistor has a channel made from at least one carbon nanotube or nanowire, wherein data is stored by varying the number of carbon nanotubes or nanowires used in the channel, wherein the channel is at least one carbon nanotube or nanowire which allows current to flow through it.

The above and/or other aspects, features and/or advantages of various embodiments will be further appreciated in view of the following description in conjunction with the accompanying figures. Various embodiments can include and/or exclude different aspects, features and/or advantages where applicable. In addition, various embodiments can combine one or more aspect or feature of other embodiments where applicable. The descriptions of aspects, features and/or advantages of particular embodiments should not be construed as limiting other embodiments or the claims.

BRIEF DESCRIPTION OF THE DRAWINGS

The above and other features and advantages of embodiments of the present invention will become more apparent by describing in detail exemplary embodiments thereof with reference to the attached drawings in which.

DETAILED DESCRIPTION OF THE PREFERRED EMBODIMENTS

While the present invention may be embodied in many different forms, a number of illustrative embodiments are described herein with the understanding that the present disclosure is to be considered as providing examples of the principles of the invention and such examples are not intended to limit the invention to preferred embodiments described herein and/or illustrated herein.

In one embodiment of the invention, the number of CNTs in a CNFET or the number of NWs in an NWFET, is controlled in order to implement a multi-valued ROM (read only memory) device. For example, to achieve a 2-bit multi-valued ROM, a cell must be capable of storing four different memory states. This can be achieved by controlling the number of nanotubes/nanowires as follows:

1. $0^{th}$ state: no (CNT/NW)
2. $1^{st}$ state: n*(CNT/NW)
3. $2^{nd}$ state: 2n*(CNT/NW)
4. $3^{rd}$ state: 3n*(CNT/NW), where n=1, 2, 3, . . . .

One tube/wire (n=1) per state may be chosen or multiple tubes/wires per state may be chosen (n=2, 3, . . . ), depending on the resolution requirement between the different states and the area-overhead desired. Thus, a single transistor memory cell has the capability to store one, of four possible 2-bit values.

Similarly, a 3-bit ROM can be implemented to store any of 8 ($2^3$) different states by controlling the number of tubes/wires and a 4-bit ROM cell to store one of 16 ($2^4$) possible states the same way. Since the typical diameter of a nanotube (CNT) or a nanowire (NW) can be as small as a few nanometers, many such tubes/wires can be accommodated in a small size transistor. That is, the CNTs or NWs can be placed side by side, or stacked on top of each other. Therefore, larger multi-valued ROMs can also be easily implemented without significantly affecting the transistor size.

Further, there is no theoretical limit to the size (2-bit, 3-bit, 4-bit, . . . ) of multivalued ROMs that can be implemented according to this embodiment. Thus, the present embodiment will significantly reduce the size of a ROM compared to the area requirement using a single bit transistor storing only the binary states ('0' or '1'). For example, using 2-bit ROM memory cells the size of the ROM can be reduced by two times compared to that of using single bit memory cells. The size of the memory cell can be reduced by 3 and 4 times by using 3-bit and 4-bit cells, respectively.

Further, the multi-valued ROM can be implemented using CNFET/NWFET as ROM cells while using conventional silicon transistors for other circuitry. It can also be suitably implemented using three dimensional (3D) process technology, where CNFET/NWFET ROM cells can be fabricated on top of the CMOS circuitry.

Figure 2A:
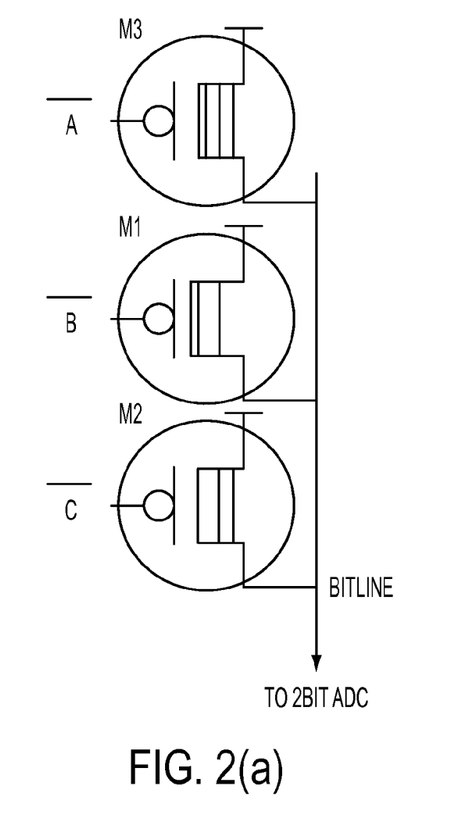
FIG. 2(a) shows an implementation of a multi-valued ROM using a carbon nanotube/nanowire FET.

In the example shown in FIG. 2(a), P-type FETs are used to implement the multi-valued ROM. N-type FETs could also be used to implement the memory cell, using the appropriate terminal connections. Further, there can be NOR, NAND, or dynamic type multi-valued ROM implementation using CNFETs/NWFETs. Similar to the example shown in FIG. 2(a), 8 valued (3-bit) cells, 16 valued (4-bit) cells, or more can also be implemented using CNFETs/NWFETs by controlling the number of tubes/wires.

Figure 2B:
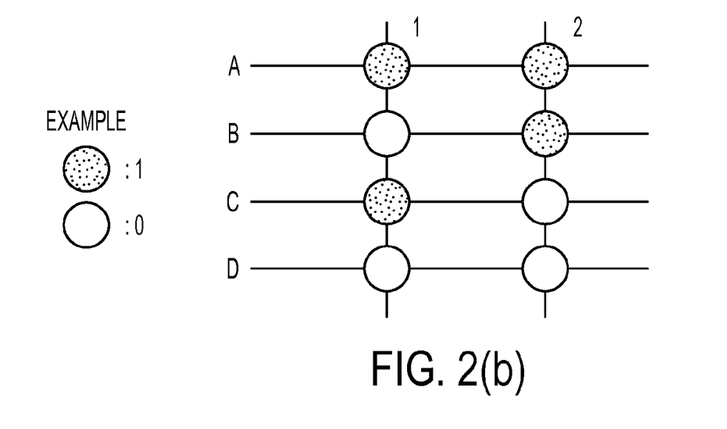
FIG. 2(b) shows an example of a memory data table of the multi-valued ROM of FIG. 2(a)

FIG. 2(b) shows an example memory data table using 2-bit ROM cells. The example memory data table has four rows (A, B, C, and D) and two columns (1, 2), with black circles representing '1's and empty circles representing '0's. Each row in this example can be implemented using one two-bit ROM cell made of CNFETs/NWFETs as shown in FIG. 2(a). For example, the transistor M3 has 3 tubes/wires in its channel storing the equivalent value for the 2-bit binary data, "11", as shown in row 'A' of FIG. 2(b). Similarly, M1 and M2 have 1 and 2 tubes/wires to store the binary data '01' and '10' in rows 'C' and 'B'.

Finally, no transistor may be used to store a 2-bit binary data '00'. Note that the same ROM can also be used with an integer multiple (n=2, 3, . . . ) of tubes/wires per state (value) as mentioned before. It should also be noted that this is just an example and that there could be various other ways to implement the multi-valued ROM using CNFETs/NWFETs.

Figure 3A:
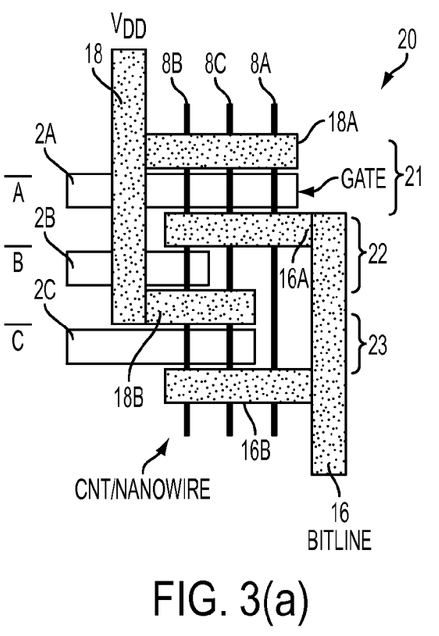
FIG. 3(a) shows a schematic layout of a memory block according to a first embodiment.

FIG. 3(a) shows a possible way of implementing CNFETs/NWFETs with a different number of CNTs in the transistor channel, according to a first embodiment. Although shown using CNTs, NWs can also be used, either entirely, or together with CNTs. FIG. 3(a) shows a possible layout design of three transistors, as shown in FIG. 2, with one CNT per state. In this technique, by selecting the gate, the number of CNTs, through which current flows, can be conveniently controlled.

As shown in FIG. 3(a), a ROM 20 has multivalued transistors 21, 22 and 23, positioned adjacent to each other. Gate 2A is part of transistor 21, gate 2B is part of transistor 22 and gate 2C is part of transistor 23. A voltage source $V_{DD}$ 18 is shown along the top edge of gate 2A and in between gates 2B and 2C. A bitline 16A is shown between gates 2A and 2B, and a bitline 16B is shown along the bottom edge of gate 2C. Both $V_{DD}$ 18 and bitline 16 are conductors.

CNTs 8 are positioned across $V_{DD}$ 18 and gates 2A, 2B and 2C. As shown in FIG. 3(a), CNT 8B spans gates 2A, 2B and 2C; CNT 8C spans gates 2A and 2C; and CNT 8A spans gate 2A. Without any electric field applied to CNTs 8, no current flows through CNTs 8 from $V_{DD}$ 18 to bitline 16. Once an electric field is applied to CNTs 8, they become conductive and current is able to freely flow through them.

Each CNT 8 has very similar physical and electrical properties. Specifically, the internal resistance in the CNTs is very similar. That is, if the same voltage was applied across two CNTs, the current flowing through each CNT would be nearly identical.

If the stored value of multivalued memory transistor 21 is to be read, a voltage is applied to gate 2A. This creates an electric field which reduces the internal resistance in the CNTs 8A, 8B and 8C, near gate 2A. Current is then able to flow from $V_{DD}$ 18 through CNTs 8 and into bitline 16.

As shown in FIG. 3(a), three CNTs, 8A, 8B and 8C are positioned adjacent to gate 2A. Because of the electrical properties of the CNTs 8, a virtually identical current will run through each of the three CNTs 8A, 8B and 8C, starting from the $V_{DD}$ 18A positioned above gate 2A and ending at the bitline 16A, positioned in between gates 2A and 2B. This current then travels down bitline 16 and is outputted from memory block 20.

By measuring the output current of multivalue transistor 21, a memory value can be obtained. Specifically, because each of the CNTs produce the same amount of current for a given voltage, the current value is quantized at specific, discrete levels. A particular quantized current level can then be associated with a memory value. In this way, each additional CNT used in a channel will produce an incrementally higher level of output current. Thus, as shown in FIG. 3(a), transistor 21 will produce three units of current; each unit of current corresponding to a current flowing through a CNT.

To obtain the data stored in multivalued memory transistor 22, a voltage is applied to gate 2B, allowing current to flow from $V_{DD}$ 18 through CNT 8B. More specifically, current will flow from $V_{DD}$ 18B, through CNT 8B and into bitline 16A. As shown in FIG. 3(a), this will be the only current to flow into bitline 16. Thus, one unit of current will flow into bitline 16.

To obtain the data stored in multivalued memory transistor 23, a voltage is applied to gate 2C, allowing the current to flow from $V_{DD}$ 18 through CNT 8C. More specifically, current will flow through $V_{DD}$ 18B, through CNTs 8B and 8C and into bitline 16B. Thus, two units of current will flow into bitline 16.

Figure 3B:
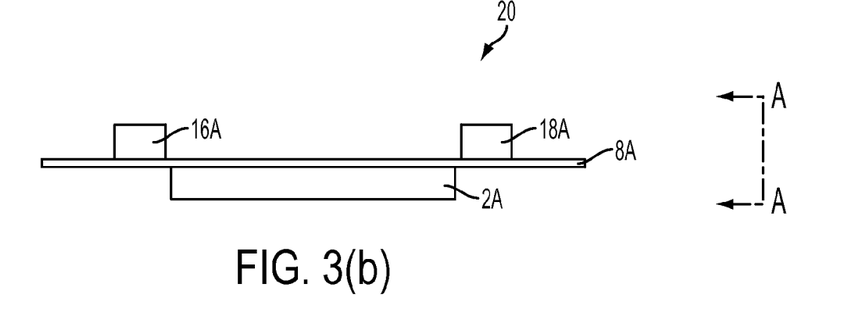
FIG. 3(b) shows a front elevation cross-sectional view of a single transistor, or memory cell, in the memory block according to FIG. 3(a)

FIG. 3(b) shows a front elevation view of memory block 20. As shown in FIG. 3(b), bitline 2A is located adjacent to bitline 16A and $V_{DD}$ 18A. CNT 8A contacts both bitline 16A and $V_{DD}$ 18A.

Figure 3C:
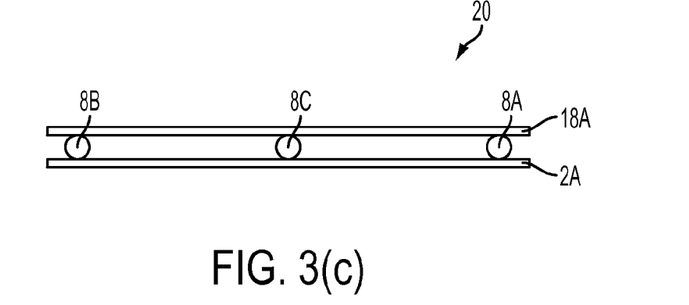
FIG. 3(c) shows a side elevation cross-sectional view of a single transistor in the memory block according to FIG. 3(a), taken along the line A-A.

FIG. 3(c) shows a side elevation view of memory block 20 along line A-A of FIG. 3 (b).

Figure 3D:
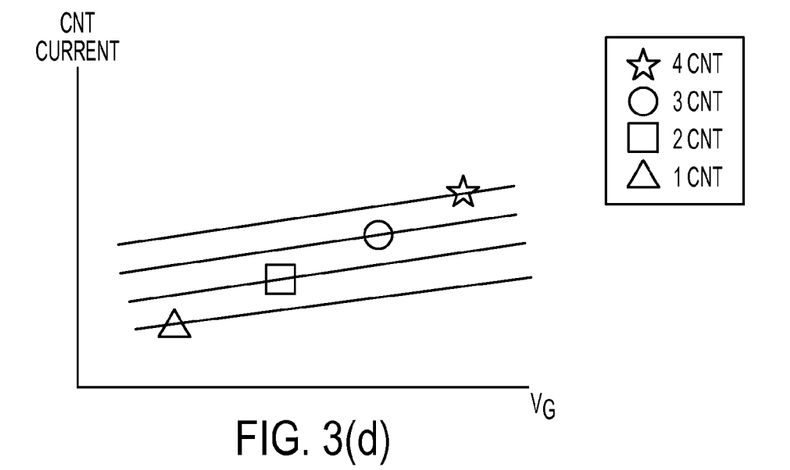
FIG. 3(d) shows a graph of the $I_{DS}$ current using different numbers of carbon nanotubes or nanowires according to the memory block as shown in FIG. 3(a)

FIG. 3(d) is a graph showing the increase in output current as more CNTs are added to the transistor channel. As is apparent from the graph, each added CNT contributes to a discrete increase in output current.

Figure 4:
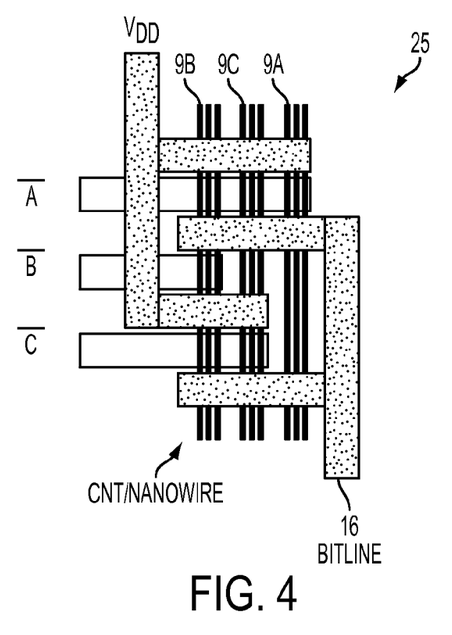
FIG. 4 shows a schematic layout of a memory block according to a second embodiment.

FIG. 4 shows a second embodiment of a multi-valued ROM 25 using a CNT/NW channel. The general layout of FIG. 4 is similar to that shown in FIG. 3(a), however, the embodiment uses sets of three CNTs, 9A, 9B and 9C to distinguish amongst the different saved data. That is, instead of using a single CNT to represent a piece of saved data or a different data state, this embodiment uses 3 CNTs to represent a piece of saved data or a different data state.

However, the embodiment is not limited to three CNTs. Two CNTs, four CNTs or more could be used to represent a saved piece of data, depending on the desired resolution. The more CNTs are used to represent a single piece of data, the larger the difference in current will be from one state to another state, thus providing a higher resolution. However, the more CNTs are used to represent a single piece of data, the more power is used.

Figure 5:
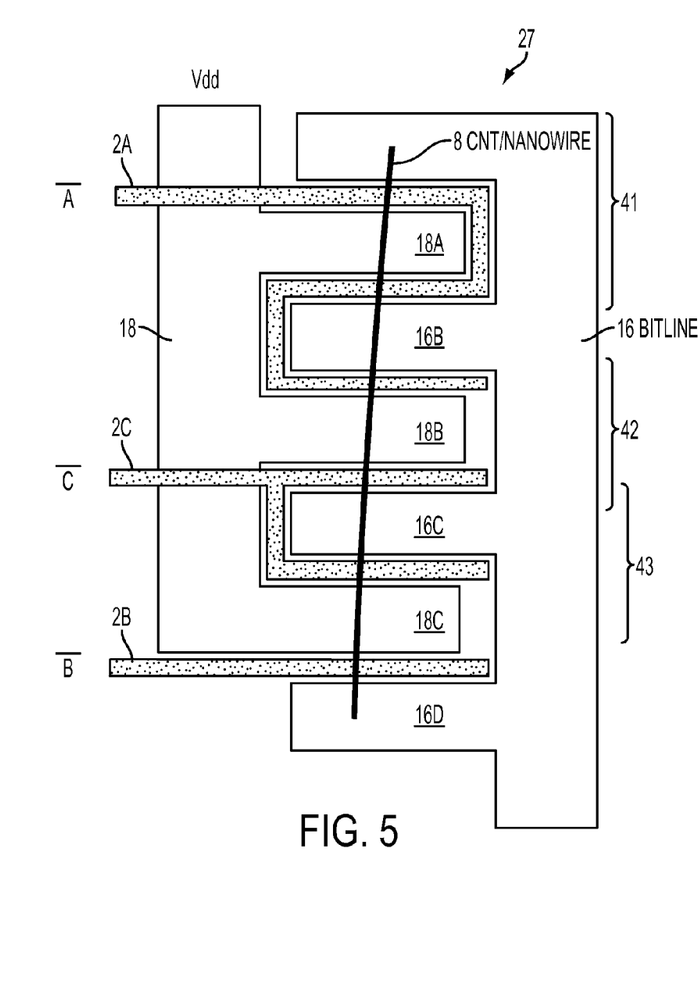
FIG. 5 shows a schematic layout of a memory block according to a third embodiment.

FIG. 5 shows a third embodiment using a memory block 27 with a single CNT or nanowire. In this embodiment, different states are implemented using multiple fingers as a gate. The operation of the device is similar to that discussed above regarding the embodiment shown in FIG. 3(a).

When reading the memory of transistor 41, a voltage is applied to gate 2A. A current will then flow from $V_{DD}$ 18A, through CNT 8 and into bitlines 16A and 16B. Further, a current will flow from $V_{DD}$ 18B, through CNT 8 and into bitline 16B. Thus, three units of current will flow into bitline 16.

When reading the memory of transistor 42, a voltage is applied to gate 2C. A current will then flow from $V_{DD}$ 18B, through CNT 8 and into bitline 16C. A current will also flow from $V_{DD}$ 18C, through CNT 8 and into bitline 16C. Thus, two units of current will flow into bitline 16.

When reading the memory of transistor 43, a voltage is applied to gate 2B. A current will then flow from $V_{DD}$ 18C, through CNT 8 and into bitline 16D. Thus, one unit of current will flow into bitline 16.

Figure 6:
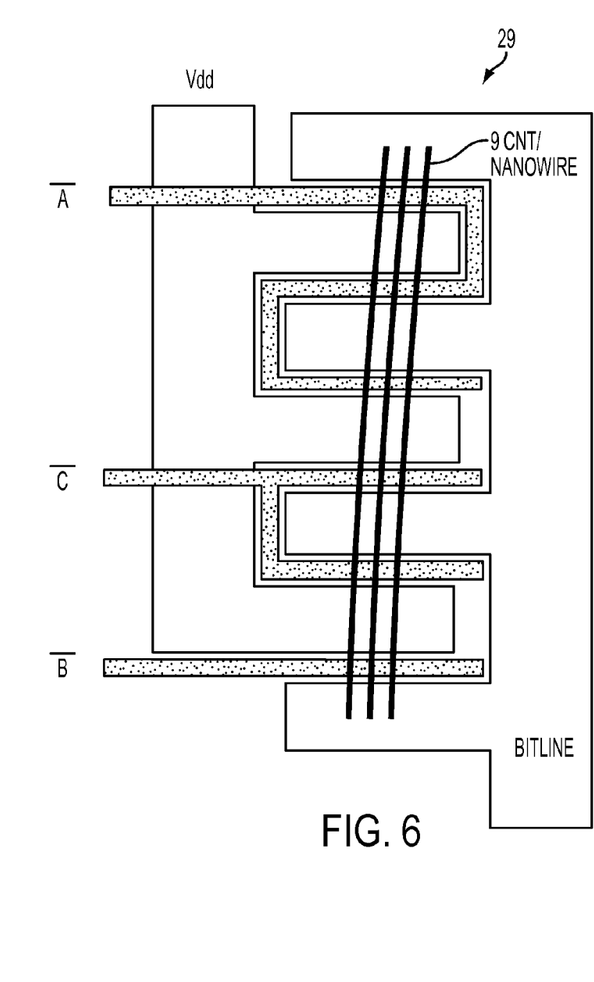
FIG. 6 shows a schematic layout of a memory block according to a fourth embodiment.

FIG. 6 shows a fourth embodiment with multiple CNTs/NWs to increase the transistor strength. The memory block 29 works in a similar fashion to that shown in memory block 27 in FIG. 5. The current through the CNTs will flow in the same way as discussed with respect to the third embodiment shown in FIG. 5, however, there will be three times as much current flowing in the memory block 25 as that of memory block 23. That is, each unit of current is multiplied by 3.

This greater flow in current will lead to a larger resolution, but will also require more power.

Figure 7:
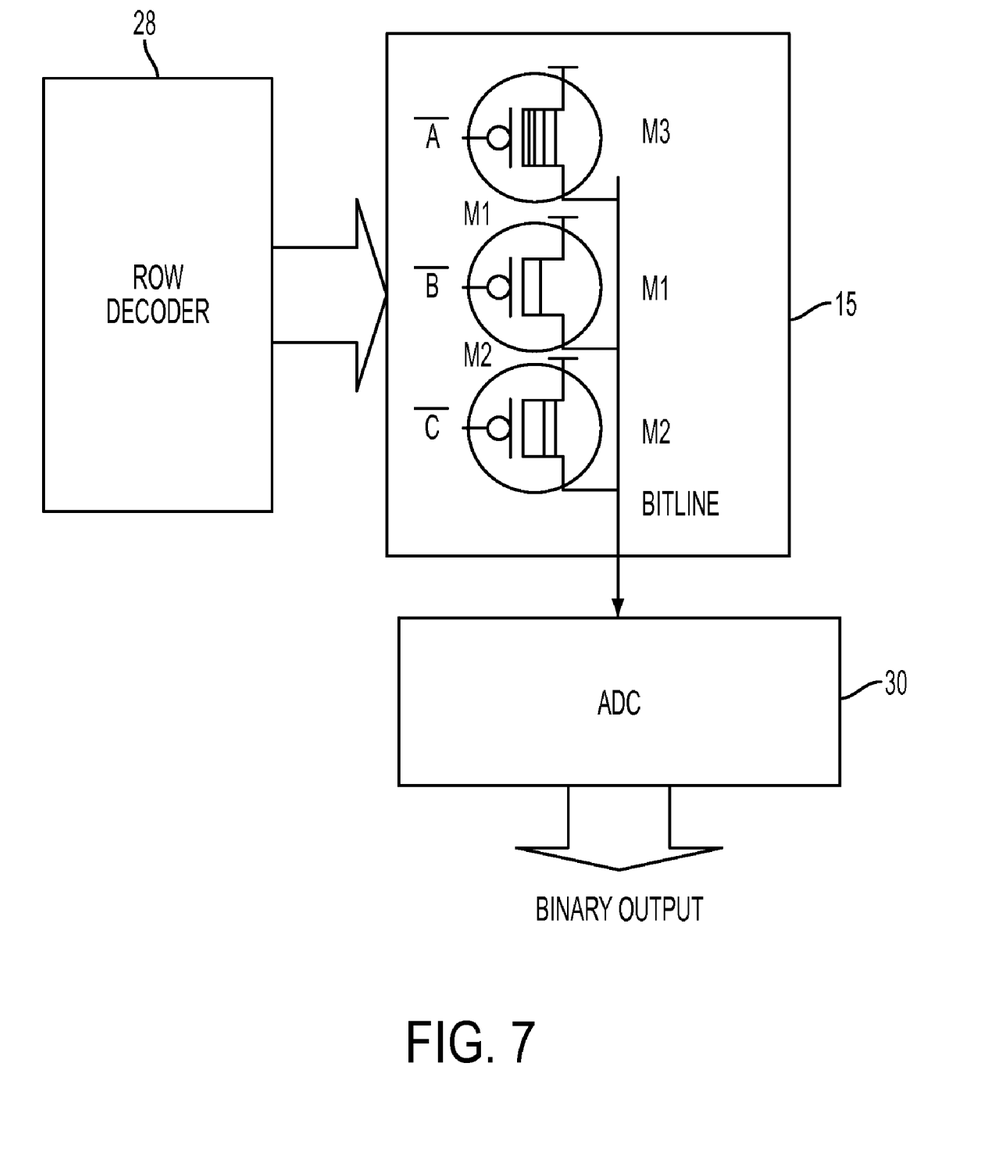
FIG. 7 shows a schematic view of a first implementation of a multi-valued memory block according to an embodiment.

FIG. 7 shows the schematic block diagram of a possible read operation of a CNFET/NWFET based multi-valued ROM 15. The row decoder circuit 28 is used to select a particular row in the ROM, i.e., to apply an appropriate voltage ('0' for PFET and 'Vdd' for NFET) to the gates of all transistors in that row to make them ON (conducting). When a transistor (cell) is in the ON state, current flows through the bitline. The amount of current will depend on the number of tubes/wires in the channel, representing data stored in the cell. This current can be converted into a digital output using an analog to digital converter (ADC) 30 as shown in FIG. 7. Depending on the multi-valued ROM, the ADC 30 output can be of 2, 3, or 4-bits or larger. The current can also be sensed using a series resistance if an analog voltage output is desired.

Figure 8:
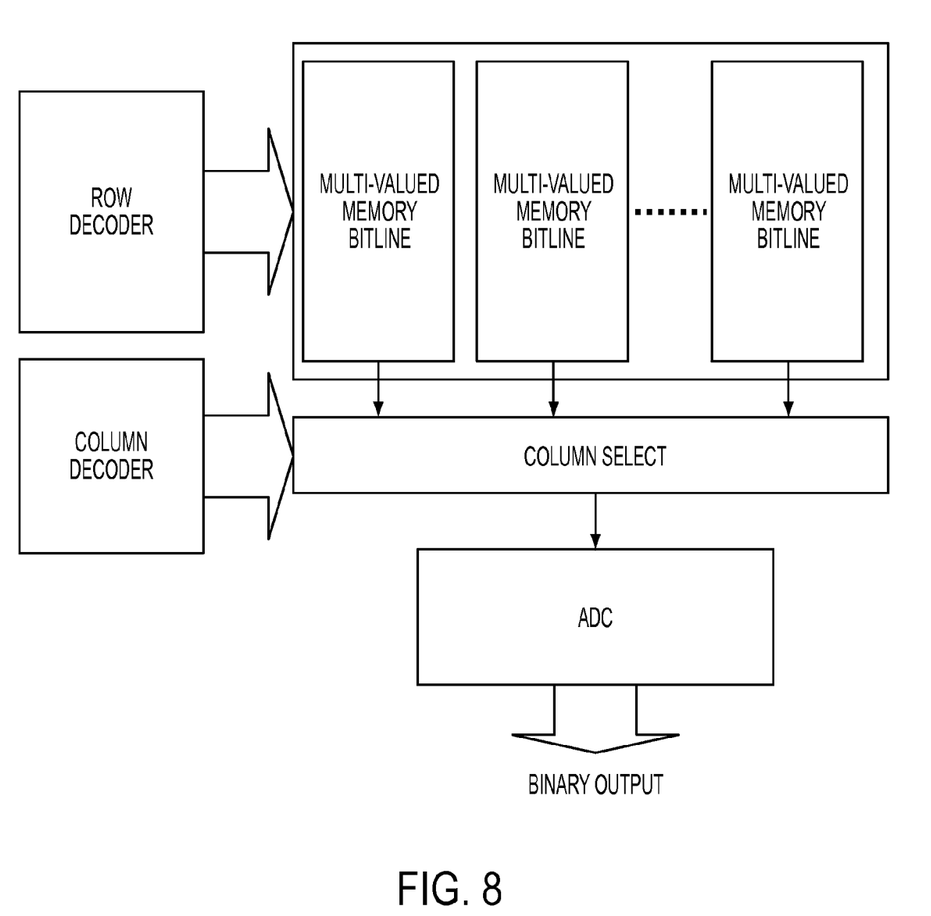
FIG. 8 shows a schematic view of a second implementation of a multi-valued memory block according to an embodiment.

FIG. 8 further shows a schematic block diagram of a multi-valued ROM 36 where an ADC 30 can be shared among multiple bitlines. In this design, the column decoder 32 selects a column (bitline) and the column select 34 allows the selected column (bitline) to be sensed by the ADC 30.

While illustrative embodiments of the invention are set forth and described herein, the present invention is not limited to the various preferred embodiments described herein, but includes any and all embodiments having equivalent elements, modifications, omissions, combinations (e.g., of aspects across various embodiments), adaptations and/or alterations as would be appreciated by those in the art based on the present disclosure. The limitations in the claims (e.g., including that to be later added) are to be interpreted broadly based on the language employed in the claims and not limited to examples described in the present specification or during the prosecution of the application, which examples are to be construed as non-exclusive. For example, in the present disclosure, the term "preferably" is nonexclusive and means "preferably, but not limited to." In this disclosure and during the prosecution of this application, means-plus-function or step-plus-function limitations will only be employed where for a specific claim limitation all of the following conditions are present in that limitation: a) "means for" or "step for" is expressly recited; b) a corresponding function is expressly recited; and c) structure, material or acts that support that structure are not recited. In this disclosure and during the prosecution of this application, the terminology "present invention" or "invention" may be used as a reference to one or more aspect within the present disclosure. The language present invention or invention should not be improperly interpreted as an identification of criticality, should not be improperly interpreted as applying across all aspects or embodiments (i.e., it should be understood that the present invention has a number of aspects and embodiments), and should not be improperly interpreted as limiting the scope of the application or claims. In this disclosure and during the prosecution of this application, the terminology "embodiment" can be used to describe any aspect, feature, process or step, any combination thereof, and/or any portion thereof, etc. In some examples, various embodiments may include overlapping features. In this disclosure, the following abbreviated terminology may be employed: "e.g." which means "for example."

What is claimed is:

1. A multivalued memory device comprising:
a first multivalued memory transistor and a second multivalued memory transistor, wherein
the first multivalued transistor has a channel made from at least one carbon nanotube or nanowire, and the second multivalued transistor has a channel made from at least two carbon nanotubes or nanowires, wherein
data is stored by varying the number of carbon nanotubes or nanowires used in each of the respective channels, wherein
the channels are at least one carbon nanotube or nanowire which allows current to flow through it.

2. The multivalued memory device according to claim 1, wherein data is read from the multivalued memory transistors by detecting the amount of current flowing through the transistors.

3. The multivalued memory device according to claim 2, wherein the gate of the first multivalued memory transistor is positioned near the channel of the first multivalued memory transistor such that when a voltage is applied to the gate of the first multivalued memory transistor, an electric field is generated near the channel of the first multivalued memory transistor.

4. The multivalued memory device according to claim 3, wherein a decoder is used to select the desired multivalued memory transistor by applying a voltage to the selected multivalued memory transistor's gate.

5. The multivalued memory device according to claim 4, wherein an analog to digital converter is positioned at the output of the multivalued memory transistor in order to determine the output current of the multivalued memory transistor.

6. The multivalued memory device according to claim 4, wherein said decoder is a row decoder.

7. The multivalued memory device according to claim 6, wherein a column decoder is positioned at the output of the multivalued memory device in order to select an appropriate column of the multivalued memory device.

8. The multivalued memory device according to claim 6, wherein an analog to digital converter is positioned at the output of the selected column of the multivalued memory transistor in order to determine the output current of the multivalued memory transistor.

9. The multivalued memory device according to claim 1, further comprising a third multivalued memory transistor and wherein: the channel of the third multivalued memory transistor is made from a carbon nanotube or nanowire.

10. The multivalued memory device according to claim 9, wherein:
the gates of the first, second and third multivalued memory transistors are arranged parallel to each and on the same plane.

11. The multivalued memory device according to claim 10, wherein:
the gates of the first, second and third multivalued memory transistors have different lengths.

12. The multivalued memory device according to claim 11, wherein:
a first voltage source is positioned in between the gates of the second and third multivalued memory transistors and wherein
a second voltage source is positioned adjacent to the first multivalued memory transistor.

13. The multivalued memory device according to claim 12, wherein:
a first bitline is position in between the gates of the first and second multivalued memory transistors and wherein
a second bitline is positioned adjacent to the third multivalued memory transistor gate.

14. The multivalued memory device according to claim 13, wherein:
the first and second voltage sources are located on the same plane as the first and second bitlines.

15. The multivalued memory device according to claim 12, wherein:
a first carbon nanotube or nanowire is positioned such that it contacts the first and second voltage sources and the first and second bitlines, and wherein:
the first carbon nanotube or nanowire extends directly above or below the first, second and third gates.

16. The multivalued memory device according to claim 15, wherein:
a second carbon nanotube or nanowire is positioned such that it contacts the first and second voltage sources and the first and second bitlines, and wherein:
the second carbon nanotube or nanowire extends directly above or below the first and third gates.

17. The multivalued memory device according to claim 16, wherein:
a third carbon nanotube or nanowire is positioned such that it contacts the first voltage source and first and second bitlines, and wherein:
the third carbon nanotube or nanowire extends directly above or below the first gate.

18. The multivalued memory device according to claim 17, wherein:
the memory device uses P-type or N-type transistors, or wherein the memory device uses NAND or NOR gates.

19. A method of storing data using a plurality carbon nanotubes or nanowires in a field effect transistor, wherein only carbon nanotubes or nanowire are used as the transistor channel, said method comprising:
applying a voltage to a gate of a desired carbon nanotube or nanowire transistor, measuring the output current from the transistor, and associating the measured output current with a digital memory value.

20. The method of storing data using carbon nanotubes or nanowires according to claim 19, wherein
an analog to digital converter is used to convert the output current into the digital value.

* * * * *